(12) United States Patent
Bingham et al.

(10) Patent No.: US 11,740,872 B2
(45) Date of Patent: Aug. 29, 2023

(54) DETECTION OF UNINTENDED DEPENDENCIES IN HARDWARE DESIGNS WITH PSEUDO-RANDOM NUMBER GENERATORS

(71) Applicant: INTERNATIONAL BUSINESS MACHINES CORPORATION, Armonk, NY (US)

(72) Inventors: Bradley Donald Bingham, Austin, TX (US); Jason Raymond Baumgartner, Austin, TX (US); Viresh Paruthi, Austin, TX (US); Praveen S. Reddy, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 555 days.

(21) Appl. No.: 17/035,794

(22) Filed: Sep. 29, 2020

(65) Prior Publication Data

US 2022/0100474 A1    Mar. 31, 2022

(51) Int. Cl.
  *G06F 7/58* (2006.01)
  *G06F 30/33* (2020.01)
  *G06F 30/20* (2020.01)

(52) U.S. Cl.
  CPC .............. *G06F 7/584* (2013.01); *G06F 30/20* (2020.01); *G06F 30/33* (2020.01); *G06F 2207/581* (2013.01)

(58) Field of Classification Search
  CPC ........... G06F 30/20; G06F 30/33–3323; G06F 7/584; G06F 2207/581
  See application file for complete search history.

(56) References Cited

U.S. PATENT DOCUMENTS 6,141,669 A    10/2000  Carleton
2019/0129694 A1*  5/2019  Benton ................... G06F 7/582
(Continued)

FOREIGN PATENT DOCUMENTS

CN       114548008 A  *  5/2022

OTHER PUBLICATIONS

V. Marudhai, "Implementation of LFSR on ASIC," 2012 Annual IEEE India Conference (INDICON), Kochi, India, 2012, pp. 275-279 (Year: 2012).*

(Continued)

*Primary Examiner* — Matthew D Sandifer
(74) *Attorney, Agent, or Firm* — L. Jeffrey Kelly

(57) ABSTRACT

A method, a computer system, and a computer program product for detection of unintended dependencies between hardware design signals from pseudo-random number generator (PRNG) taps is provided. Embodiments of the present invention may include identifying one or more tap points in a design as an execution sequence. Embodiments of the present invention may include sampling the tap points by propagating the tap points in the design with different delays. Embodiments of the present invention may include defining observation points to identify tap collisions based on the tap points. Embodiments of the present invention may include identifying tap collisions. Embodiments of the present invention may include identifying one or more sources of the tap collisions in the design. Embodiments of the present invention may include eliminating the one or more sources of uninteresting tap collisions out of the tap collisions and filtering one or more of the tap collisions.

20 Claims, 8 Drawing Sheets

(56) References Cited

U.S. PATENT DOCUMENTS

2019/0361678 A1    11/2019  Kim
2021/0303268 A1*   9/2021   Sloss ..................... G06F 7/584

OTHER PUBLICATIONS

Islam, Md Fokhrul, MA Mohd Ali, and Burhanuddin Yeop Majlis, "FPGA implementation of an LFSR based pseudorandom pattern generator for mems testing," International Journal of Computer Applications, vol. 75, No. 11, 2013 (Year: 2013).*
Mell et al., "The NIST Definition of Cloud Computing", Recommendations of the National Institute of Standards and Technology, Special Publication 800-145, Sep. 2011, 7 pages.

* cited by examiner

US 11,740,872 B2

DETECTION OF UNINTENDED DEPENDENCIES IN HARDWARE DESIGNS WITH PSEUDO-RANDOM NUMBER GENERATORS

BACKGROUND

The present invention relates generally to the field of computing, and more particularly to pseudo-random number generators (PRNGs). Pseudo-random number generators are often implemented by linear feedback shift registers (LFSRs), which are registers that have values determined by its previous state. The input register bit value is a linear function of the previous state of the register bit value. The register will eventually repeat a cycle due to the register having a finite number of states.

SUMMARY

Embodiments of the present invention disclose a method, a computer system, and a computer program product detection of unintended dependencies between hardware design signals from pseudo-random number generator (PRNG) taps. Embodiments of the present invention may include identifying one or more tap points in a design. Embodiments of the present invention may include sampling the tap points by propagating the tap points in the design with different delays. Embodiments of the present invention may include defining observation points to identify tap collisions based on the tap points. Embodiments of the present invention may include identifying tap collisions. Embodiments of the present invention may include identifying one or more sources of the tap collisions in the design. Embodiments of the present invention may include eliminating the one or more sources of uninteresting tap collisions out of the tap collisions. Embodiments of the present invention may include filtering one or more of the tap collisions.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
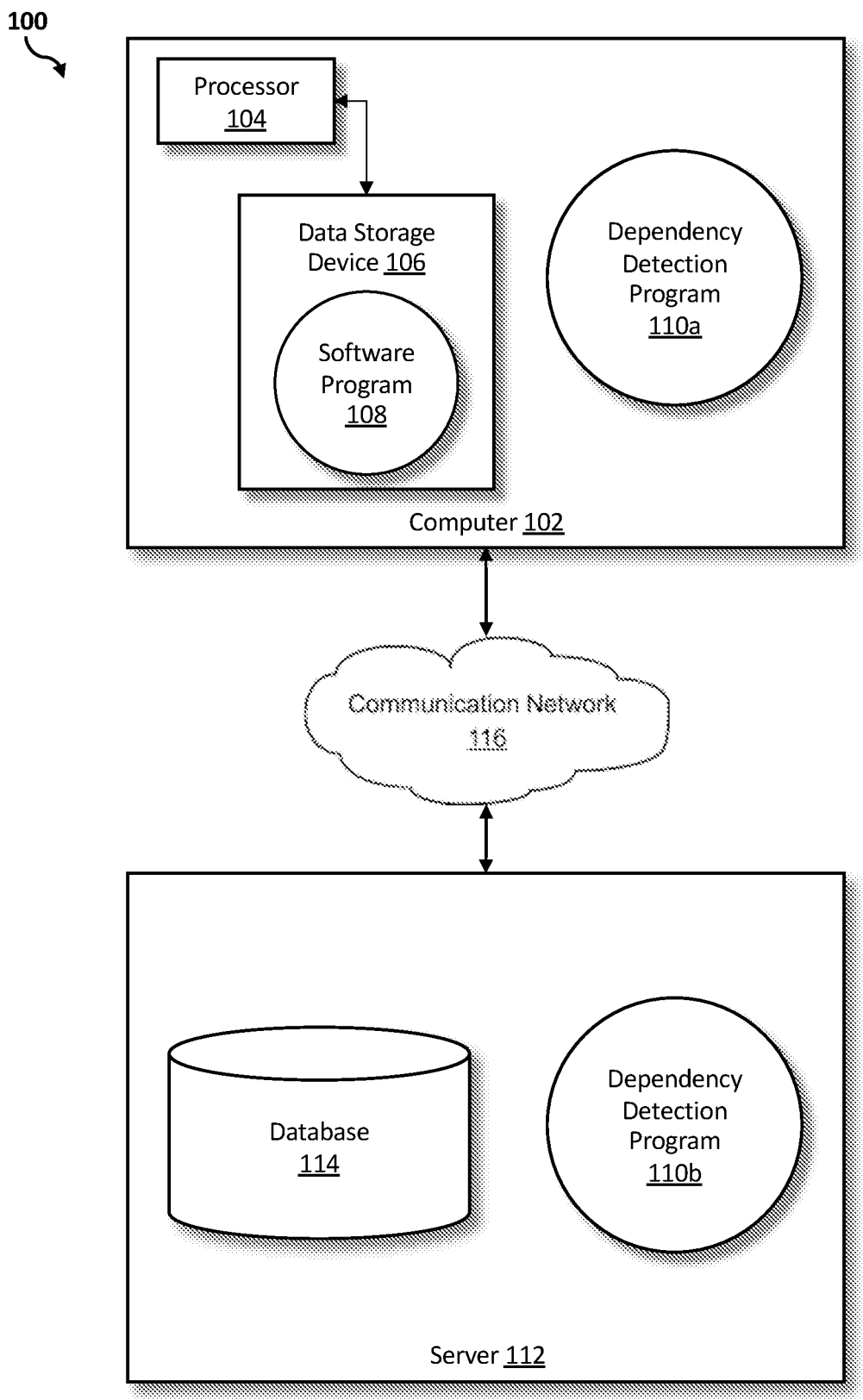
FIG. 1 illustrates a networked computer environment according to at least one embodiment.

Detailed embodiments of the claimed structures and methods are disclosed herein, however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

As previously described, pseudo-random number generators are often implemented by linear feedback shift registers (LFSRs), which are registers that have values determined by its previous state. The input register bit value is a linear function of the previous state of the register bit value. The register will eventually repeat a cycle due to the register having a finite number of states.

Linear feedback shift registers (LFSRs) are used in many hardware designs to make pseudo-random decisions. Given the shifting nature of LFSRs, the pseudorandomness of sampled LFSR bits (or taps) can be lost due to temporal alignment effects. Temporal alignment effects may cause unintended dependence between distinct taps. Depending on how a design under test (DUT) reacts to individual taps, the intent of the design of consuming multiple independent pseudo-random bits creates scenarios of overly deterministic behavior. Pseudo-random bits may come from multiple taps of the same LFSR and may influence the design with a temporally aligned behavior. Temporally aligned behavior is an undesired deterministic behavior that forms the basis of LFSR-tap collisions.

Deterministic behavior may create a risk of a degradation in performance, such as degrading chip performance or introducing functional bugs such as deadlocks. More severe degradations may occur due to deterministic behavior, such as chip level design determinism. For example, in order to save on chip costs, surface area and power, multiple design components may be implemented by multiple chip or chipset designers. The multiple designers will sample bits of the same LFSR and possibly introduce a chip-level determinism that no individual design component or designer is aware of. Sampling may behave far more deterministic than expected due to time shifting or latching and XOR dependencies within the LFSR implementation and the fanout design logic that causes collisions among the sampled LFSR taps.

Current approaches to solving deterministic behavior are manually intensive visual inspections of register transfer level (RTL) code and chips that are overdesigned. Manually intensive visual inspections of register transfer level (RTL) code includes documenting, in a spreadsheet, all LFSR taps used across the chip and clocking the delays along the paths where signals depending on the taps converge. This process is expensive, manual and error-prone such that there is a high risk of missed dependencies. This process can also result in incorrect data over time as the design is modified without updating the spreadsheet. Additionally, the process is prone to flagging unsensitizable potential collisions that can exist structurally but cannot actually ever be concurrently sensitized under a driving scenario.

Overdesigned chips use more LFSRs, larger LFSRs or more expensive routing logic to propagate LFSR tap data throughout a chip in order to reduce the risk of potential or unexpected collisions. Overdesigning can negatively affect the surface area, the power, the delay and the cost of a chip. False timing paths may occur when a specific structural path through the logic is flagged as a possible slow path and thus, violates the desired clock frequency.

While LFSR and pseudo-random number generator (PRNG) design may be a large focus in the industry, LFSR and PRNG verification is not. Additionally, overly deterministic behavior and temporal alignments reduce the pseudo-randomness of the bits. Therefore, it may be advantageous to, among other things, provide more than one solution to analyze and detect unintended dependencies in a design under test (DUT) that includes a LFSR or other PRNGs in a formal verification testbench environment.

The following described exemplary embodiments provide a system, a method and a program product for unintended dependencies detection in pseudo-random number generators (PRNGs). As such, embodiments of the present invention have the capacity to improve the technical field of PRNGs and shift register testing by verifying an arbitrary fanout design logic that samples LFSR taps. The verification may only require a user to specify LFSR taps and observation signals of interest for a collision analysis determination. More specifically, functional dependencies are automatically detected as a reported trace that reflects sensitizable scenarios and the results of the automatic detection are leveraged to adjust the chosen LFSR tap points, such as performance or correctness, to eliminate the determinism. Additionally, the system, method and program product can be used to optimize the chip area, chip power, chip delay and chip cost by enabling a systematic analysis of alternative LFSR solutions.

LFSRs are often used to implement pseudo-random number generators (PRNGs) in hardware. PRNG may include, for example, a LFSR, a Fibonacci LFSR or a Galois LFSR. The use case provided herein will show LFSRs as a target pseudo-random number generator (PRNG) implementation. Additionally, the techniques provided herein for the LFSR use case are applicable to any implementation of PRNGs within a hardware design. Additionally, the LFSR techniques provided are also applicable to any PRNG where multiple bits (taps) may be simultaneously sampled and the taps have a time-shifted correlation.

The solutions provided have a distinct advantage over monotonous and incomplete tracking by hardware design engineers performing a visual code analysis of LFSR taps, subsequent latch delays and identifying signals that depend on multiple taps. The solutions remove human error that may be associated with timing changes and offers complete proofs of no unintended dependencies by leveraging formal verification algorithms. Additionally, the solutions allow the LFSR size and the number of LFSRs to be significantly reduced, as opposed to a designer erring on the side of caution and using additional or larger LFSRs.

According to an embodiment, a verification of the arbitrary fanout design logic that samples LFSR taps is done with the design intent of sampling independent pseudorandom data sources. A formal verification of pseudorandomness between any pair of sampled bits from a LFSR is created to verify in a cone-of-influence of one or more internal signals of a sequential circuit design. Independent PRNG taps may be driven differently across multiple design copies while other design inputs are driven identically across copies. Differently driven or driving differently may be terms that represent multiple approaches to leverage a 2-way or n-way model comparison. A formal equivalence checking-like testbench is generated between two copies of a model (e.g., EARLY and LATE), where the LFSR taps are model inputs and the corresponding inputs are driven identically. The selection logic is generated to nondeterministically choose a pair of LFSR taps (e.g., a and b), to nondeterministically override EARLY.a with a three-valued logic constant X and override LATE.b with X, a number of timesteps later that is equal to the shifting distance between taps a and b, which are driven differently. A three-valued model checking algorithm is run to determine if the observation point simultaneously has the value X in both models which would indicate a simultaneous dependence on LFSR taps that carry the same Boolean value.

A LFSR tap collision or LFSR tap collisions are undesired deterministic behavior and a LFSR tap collision may be defined as an execution sequence that shows the behavior of a design signal or a set of design signals that concurrently depend on the values of two or more (2+) LFSR taps. The time delays of the two or more (2+) LFSR taps, through design latches, result in unexpectedly deterministic behavior of the design signal or the set of design signals. The behavior of the LFSR taps with reference to an LFSR implementation may be overly deterministic if multiple taps are referenced. The overly deterministic behavior may be due to the presence of multiple taps, which often indicates a design intent to reference multiple uncorrelated pseudorandom decisions. Thus, two pseudorandom decisions are often intended to behave independently, and should not influence the design in a deterministic manner due to shift time delay relations between the values of the taps and the time delay of latches in the design between the taps and other design signals. Using a different LFSR tap set for different decisions may allow the possibility that the set of taps take different values during the same cycle, thus, increasing the range of simultaneous outcomes of the pseudorandom decisions. An example of an execution sequence includes an all events trace (AET), waveform trace or trace. All events trace (AET), waveform trace and trace may be considered interchangeable terms.

According to an embodiment, a tap collision as an execution sequence is defined. Then, one or more observation points for possible tap collisions are defined. Using an observation point, two cases for detecting collisions are identified. One case is to assume a multi-value testbench that is prone to X-pessimism. Another case is to describe how to eliminate the X-pessimism. Then, cutpoint taps are identified and converted to primary inputs.

According to an embodiment, an equivalence checking-like model comparison is performed to check all possible LFSR tap collisions. Then, uninteresting collisions are eliminated. The source or location of the collisions in a design are identified.

According to an embodiment and alternate embodiments, unintended dependencies are detected in linear feedback shift register (LFSR) based hardware designs with an additional testbench constraint. Another alternate embodiment includes unintended dependencies being detected in Galois linear feedback shift registers (LFSRs) among n-bit collisions. An additional alternate embodiment is a process for eliminating X-pessimism.

Referring to FIG. 1, an exemplary networked computer environment 100 in accordance with one embodiment is depicted. The networked computer environment 100 may include a computer 102 with a processor 104 and a data storage device 106 that are enabled to run a software program 108 and a dependency detection program 110a. The networked computer environment 100 may also include a server 112 that is enabled to run a dependency detection program 110b that may interact with a database 114 and a communication network 116. The computer 102 may also be known as a client computer and the server 112 may also be known as a server computer. The networked computer environment 100 may include a plurality of computers 102 and servers 112, only one of which is shown. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The computer 102 may communicate with the server 112 via the communications network 116. The communications network 116 may include connections, such as wire, wireless communication links, or fiber optic cables. As will be discussed with reference to FIG. 6, server 112 may include internal components 902a and external components 904a, respectively, and computer 102 may include internal components 902b and external components 904b, respectively. The server 112 may also operate in a cloud computing service model, such as Software as a Service (SaaS), Analytics as a Service (AaaS), Blockchain as a Service (BaaS), Platform as a Service (PaaS), or Infrastructure as a Service (IaaS). Server 112 may also be located in a cloud computing deployment model, such as a private cloud, community cloud, public cloud, or hybrid cloud. Computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the dependency detection program 110a, 110b may interact with a database 114 that may be embedded in various storage devices, such as, but not limited to a computer/mobile device 102, a server 112, or a cloud storage service.

According to the present embodiment, a user operating a computer 102 or a server 112 may use the dependency detection program 110a, 110b (respectively) to detect unintended dependencies in linear feedback shift registers (LFSRs). The dependency detection methods are explained in more detail below with respect to FIGS. 2-5.

Figure 2:
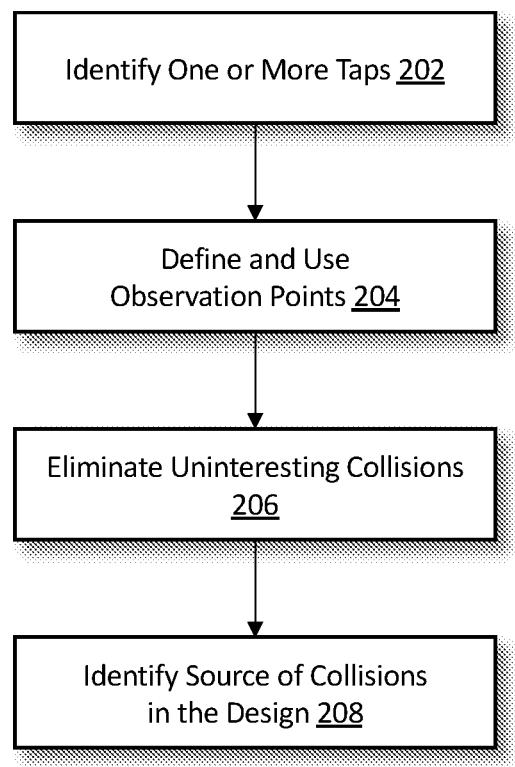
FIG. 2 is an operational flowchart illustrating a process for detecting unintended dependencies in a pseudo-random number generator (PRNG) based hardware design according to at least one embodiment.

Referring now to FIG. 2, an operational flowchart illustrating the exemplary detecting unintended dependencies in a pseudo-random number generator (PRNG) based hardware design process 200 used by the dependency detection program 110a, 110b according to at least one embodiment is depicted. The detecting unintended dependencies in a Fibonacci LFSR based hardware design process 200 may include an exhaustive collision detection process.

At 202, one or more taps are identified. One or more PRNG or LFSR tap points in a design may be identified, sampled and propagated with different delays or delay taps. A two-design (2-design) comparison similar to equivalence checking may be performed to exhaustively check and identify collisions. A design under test (DUT) example to show multiple taps from the same LFSR may be presented and includes a Fibonacci LFSR of n bits, indexed $b\_0, \ldots, b\_\{n-1\}$, and the set of bits is referred to as F. Suppose $d(c, x)$ is the timestep-delayed value of signal x, where the timestep may refer to one clock cycle in most scenarios. Suppose this LFSR has a next state that is determined by $b\_i <= d(1, b\_\{i-1\})$ for $1 < i < n$; and $b\_0 <= d(1, \text{xor}(x\_1, x\_2, \ldots, x\_k))$;

where each $x\_i$ is a member of F. In this notation, signal $b\_i$ may sometimes be referred to as a left-had expression relative to the assignment symbol <=, and the right-hand expression represents predicates applied to other hardware signals. Note that, aside from $b\_0$, each $b\_i$ is a time-shifted version of $b\_\{i-1\}$ in a Fibonacci LFSR.

Let T, a subset of F, be a set of taps where the taps are the LFSR bits that are sampled onto fanout signals by the design under test (DUT) and assumed by the designer to behave pseudo-randomly, and let m=|T|. This implementation of the LFSR will have an interdependence in behavior of multiple taps of the same LFSR since many bits have only 1-clock delayed copies of the prior bits. Multiple taps of the same LFSR do not act as completely independent pseudo-random bits. Completely independent pseudo-random bits act as if each bit came from an independent LFSR or independent LFSRs of different implementation or a post-reset state, since 2+ identical LFSRs with identical post-reset states behave identically to a single LFSR. However, the cost in area, power and timing overhead of introducing a separate LFSR for each pseudo-random bit required in a hardware design can be prohibitive and, thus, designs often attempt to use multiple taps of the same LFSR.

A set of examples are provided to show both collisions or no collisions among LFSR taps. One example is of two different taps of the same LFSR and is provided as follows, tap1<=LFSR1.$b\_1$; tap2<=LFSR1.$b\_2$;

decision1<=(tap1='1') and (tap2='1');

which shows a simple no collision example since tap1 and tap2 may be considered to act as independent pseudo-random tap points, provided that other design under test (DUT) logic does not temporally align them.

Another example of two different taps of the same LFSR is as follows, tap1<=LFSR1.$b\_1$; tap2<=LFSR1.$b\_2$;

$d$tap1<=$d$(1,tap1);

decision1<=($d$tap1='1') and (tap2='1');

which shows a simple collision example since tap2 is a 1-clock delayed version of tap1, and the design under test (DUT) logic delays tap1 to form dtap1. A concurrent influence of dtap1 and tap2 does not produce the design intent of using two independent pseudo-random tap points.

An additional example of two different taps of the same LFSR is as follows, tap1<=LFSR1.*b*_1; tap2<=LFSR1.*b*_2;

*d*tap1<=*d*(1,tap1);

decision1<=if(condition) then((tap1='1') and (tap2='1')) else(*d*tap1='1');

which shows a more elaborate no collision example. There is no collision due to the reasoning that if the condition is true, then decision1 only depends on tap1 or tap2 (i.e., no collision). Alternatively, if the condition is false, then decision1 only depends on dtap1 (i.e., no collision) However, a possible X-pessimism false collision may occur in this example if the condition is not evaluated as either true or false, which may cause decision1 to inaccurately appear to be combinationally dependent on both dtap1 and tap2, which are temporally aligned by the design under test (DUT) logic. This combinational dependence is orthogonal and cannot be concurrently sensitizable. However, if a multi-value testbench is used for driving ternary X values, a false collision may be detected due to X-pessimism, which may blur the orthogonality.

Note that no collision could exist if fewer than two LFSR taps are identified, or if a single LFSR tap is propagated by the design with different delays.

At 204, observation points are defined and used. Observation points may be defined to identify and analyze unintended dependencies or tap collisions among the PRNG or LFSR tap points. At the observation points, tap collisions may be calculated or enumerated. Observation points may represent sets of design signals to be analyzed for collisions. Observation points may be defined and used based on an exhaustive collision detection analysis. The exhaustive collision detection analysis may be based on design criterion (e.g., a unit or chip outputs) or input from a designer, a user or a hardware verification tool. The observation points may be exhaustively analyzed for collisions. An exhaustive collision detection analysis may include a baseline approach to a 2-tap collision detection arising from Fibonacci LFSRs that involve X-propagation analysis. The analysis may compare two copies of the design. Upon identifying collisions, a waveform trace may be produced to illustrate the behavior of EARLY or LATE models that are producing a collision.

Observation points are defined for possible tap collisions. At the defined observation points, the tap collisions are detected. The observation points may be manually detected or automatically detected. Manual detection may include, for example, a user studying the waveform and design logic to pinpoint where in the design the collisions first occur. Automatic detection may include, for example, using each output of the design as an independent observation point or by using automatic pinpointing of collision logic to identify internal collision locations.

LFSR taps may be converted into primary inputs called cutpoints. Additionally, an assumption is made that the taps are ordered according to their LFSR bit subscript, such that b_i is ordered before b_j when i<j which also means that b_j is a later LFSR bit than b_i. Cutpointing the taps or converting the taps into primary inputs may be called CUTPOINT_b_i for each b_i in T.

A nondeterministic choice between two tap points in which collisions may be detected is synthesized. For example, two sets are created, SEL_EARLY, SEL_LATE of ceil(log_2(m)) Boolean random bits constrained to take values between 0, the first tap, and m−1, the last tap, representing which tap point will be analyzed in the EARLY and LATE design, respectively. A constraint of SEL_EARLY<SEL_LATE is used to force selection of independent tap points across the EARLY and LATE compared designs, where SEL_EARLY selects tap b_i and SEL_LATE selects tap b_j. An independent selection, i not equal to j, may be optimal or important to preclude bogus reports of a collision of the same tap to itself. Note that EARLY selects a shallower b_i than LATE b_j due to the < sign. A signal, TIME_DIFF, is the nonnegative difference in the index between these bits (i.e., j−i).

A temporal case-split circuit may be synthesized. The temporal case-split circuit may nondeterministically assert, as the basis of collision detection, at one arbitrary timestep and thereafter may never assert again. The case-split circuit may include a Boolean random signal, TIME_SEL, and a register, COFACTOR_OCCURED, that initializes to zero (0), asserts and remains asserted as one (1) concurrently with TIME_SEL asserting one (1) for the first time. The signal, COFACTOR_TIME_EARLY=TIME_SEL AND NOT COFACTOR_OCCURED, defines when the collision detection will begin and for the earlier tap, SEL_EARLY is selected.

Since the EARLY tap to be analyzed is earlier than the LATE tap, COFACTOR_TIME_EARLY may be used to indicate when the EARLY (i.e., not later) tap will be analyzed for a possible collision with the LATE tap. Thus, a signal may be created, COFACTOR_TIME_LATE<=delay (TIME_DIFF, COFACTOR_TIME_EARLY) to indicate when the LATE tap may be analyzed for possible collision.

Sequential equivalence-like verification may be performed. Verification properties may be added at defined observation points to check for concurrent sensitization to differently driven taps (e.g., PRNG taps or LFSR taps) or tap collisions. A sequential equivalence-like verification may be performed by a type of two-copy (2-copy) or a two-design (2-design) comparison of the same design. A differently driven pre-defined value may be a ternary X value and the verification properties added at defined observation points may check concurrent sensitization to a ternary X value. Tap collisions may be enumerated or calculated using a multiple copy design verification model or testbench. The multi-value two-design comparison problem may include two copies of the same design, EARLY and LATE. The multi-value two-design comparison problem may be constructed when all inputs other than the selected taps are driven in common. In EARLY, drive tap b_i by EARLY.*b*_i<=mux(COFACTOR_TIME_EARLY, constant-*X*, CUTPOINT_*b*_i;

and in LATE, drive tap b_j by

LATE.*b*_j<=mux(COFACTOR_TIME_LATE, constant-*X*, CUTPOINT_*b*_j).

A sequential equivalence-like verification may be processed or run using three-value modeling (3-value modeling), where each signal can evaluate to Boolean 0, Boolean 1 or constant X, where X can be either 0 or 1. Each design input other than the selected taps are driven as random Boolean inputs, taking either 0 or 1 values. The selected taps are driven by EARLY.b_j and LATE.b_i logic as defined above.

A fail property notation may be created and named collision i_j as referenced in the following left-had expression and appearing before the assignment symbol <=. The fail property notation, collision i_j may be considered falsified in an execution sequence or waveform trace if the fail property is found to satisfy (i.e., assert Boolean 1) the right-hand expression appearing after the assignment symbol, which is a collection of predicates applied to hardware signals. The right-hand expression or a left-hand expression may refer to either side of an equality or assignment symbol, for example, the right hand-expression refers to fail properties that are defined as some predicate over hardware symbols. A falsified property may be known as a hit or hittable, which represents a failure of the corresponding property. A property may be proven as unhittable, which represents that no possible waveform trace can assert the corresponding right-hand expression. The fail property to represent a collision scenario of interest may be identified by

[fail; collision_$i\_j$]<=EARLY.$C$==$X$ and
LATE.$C$==$X$ where the right-hand expression is EARLY.C==X and LATE.C==X. This property is falsified in a waveform trace if signal EARLY.C evaluates to constant-X concurrently with signal LATE.C evaluating to X.

Multiple observation points, C_0 . . . C_obs, may be formulated or a single observation point, C, may be formulated. Observation point(s) may be formulated using various methods. One method may include that a property might be a hit if X appears on any EARLY.C_0 . . . EARLY.C.obs concurrently with X appearing on any LATE.C_0 . . . LATE.C_obs even if the concurrent X evaluation occurs between different signals in the set of multiple observation points in EARLY versus LATE. Alternatively, each observation signal may be checked with an independent fail property. The former scenario of [fail; collision_i_j] may be identified by the following fail property:

[fail; collision_$i\_j$]<=(OR_{0<=$k$<=obs}
(EARLY.$C\_k$==$X$))

AND (OR_{0<=$k$<=obs}(LATE.$C\_k$==$X$)).

If a fail property is hit, then a collision exists between b_i and b_j at the observation point or at the observation points. A verification tool may report a waveform trace to illustrate the hit and to aid a designer in understanding and correcting the design. The waveform trace may show an assertion on the right-hand expression associated with the corresponding property.

If the fail event is unhittable, then a collision does not exist between b_i and b_j at the observation points or observation gates. A fail event that is unhittable indicates that no assertion of the right-hand expression associated with the corresponding property is possible under any scenario or waveform trace.

At 206, uninteresting collisions are eliminated. Uninteresting collisions may be unintended collisions that unlikely to represent a design flaw. Some unintended dependencies or tap collisions may be design flaws and others may be considered uninteresting collisions. Uninteresting collisions, for example, may be considered uninteresting at the discretion of the user or may be collisions reasonably considered to be uninteresting. Uninteresting collisions may often occur due to sequential feedback that is common in hardware designs. For example, the current state of a state machine is influenced by all past states and past sampled values. Although the result of the current decisions made based on LFSR tap values may not tangibly be dependent on past sampled LFSR tap values, the result of current decisions may only tangentially be dependent upon the fact that a state machine is idle and ready to make another decisions based upon a current LFSR tap value.

A preferred verification solution may automatically eliminate uninteresting collisions while current verification tools may only be able to produce one waveform trace illustrating a hit of a given property. If the one waveform trace from a verification tool is deemed uninteresting, then the waveform trace may mask a more interesting scenario that represents a design flaw that should be corrected.

Eliminating unintended collisions may be combined with the exhaustive collision detection. The combination may avoid reporting collisions that are the result of sequential feedback, and thus, are likely expected and uninteresting.

An elaborate collision example showing a likely interesting collision is as follows;

rand1<=$d(1,b\_5)$;

rand2<=b_6;

four_way_choice(0:1)<=rand1 & rand2;

req0_win<=four_way_choice(0:1)="00";

req1_win<=four_way_choice(0:1)="01";

req2_win<=four_way_choice(0:1)="10";

req3_win<=four_way_choice(0:1)="11";

where rand1 is a design signal capturing a one-clock delayed sample of LSFR tap b_5, rand2 is a design signal capturing LFSR tap b_6, four_way_choice(0:1) is a two-bit-wide design signal vector concatenating rand1 and rand2, and req #_win are design signals decoding values of four_way_choice(0:1). Since a Fibonacci LFSR value of b_6 evaluates identically to a one-clock delayed version of b_5, signals req1_win and req2_win may never assert in this design as rand1 always takes the same value as rand2, which represents undesired determinism among these two LFSR taps, and is likely a design flaw. A collision exists at all 4 req #_win signals, req0_win, req1_win, req2_win and req3_win.

An example of an uninteresting collision that occurs from a sequential feedback in the arbiter (arb) control may be represented using a modified four_way_choice(0:1) with rand1<=$d(1,b\_5)$; and rand2<=b_7;

where rand2==d(1, rand1) and thus, four_way_choice(1)==d(1, four_way_choice(0)). The req0_win . . . req3_win signals may again decode the modified four_way_choice(0:1) signal, where req #_win is asserted exactly if four_way_choice(0:1) evaluates to #. The req #_win signals may feed into (i.e., be sampled by) a state machine, which is implemented using a strongly connected component (SCC) in the graph of hardware gates implementing the functionality of the hardware design. The strongly connected component (SCC) controls which pending requests may obtain a grant according to a first requester priority scheme in circular order from the winner. For example, if req #_win is asserted, then the #'th requester will get priority for the next grant. A set of req0 . . . req3 signals indicate which of the four requesters await a grant. Once req # is asserted to Boolean 1, req # will remain asserted until it is granted.

A grant (gnt) signal may be an output from the strongly connected component (SCC), defining which requester, req0 . . . req3, is allowed access to the resource under contention. The grant (gnt) signal is a four-bit-wide signal vector defined as gnt(0:3)<=[if (req #_win are all zero), then "0000" else (one-hot vector selecting the req0 . . . req3 to receive the grant)]. Thus, gnt(0:3) can only take values "0000" or one-hot-values "1000", "0100", "0010" or "0001".

Each bit of gnt(0:3) may therefore correlate to a single req #. For example, gnt(0:3) evaluates to "0000" when none of req0 . . . req3 are asserted. At most, a single bit of gnt(0:3) will be asserted such that if gnt(#) is asserted, then this means that req # was asserted and was the nearest of all pending req # to the asserted req #_win according to the arbiter's priority scheme. An observation point named collision_at_gnt1 is created for the corresponding gnt(0:3) right-hand expression by the following notation or signal such that [observable; collision_at_gnt1]<=gnt(0:3).

For the collision that occurs due to the sequential feedback in the arbiter (arb) control, assume that req0 and req1 are both asserted. A constant X may be assigned to EARLY.b_5 at time t and rand1=X at time t+1. At time t+2, an X may be assigned to req0 if the granted request does not immediately make another request. The X in the arbiter (arb) control may then collide with the X injected at b_7 at time t+2. Thus, the collisions may occur regardless of the index difference between taps, as may be a characteristic of many arbiter designs.

In some instances, a correctly implemented safe arbiter may sometimes be expected such that X collisions may be detectable for uninteresting reasons due to tap history logic. Differently driven taps in multiple design copies may be driven by a pre-defined value that is applied at different times across multiple design copies. The difference in time may be dependent on logical a time-shifted correlation or logical time-shifted correlations among corresponding taps or delay taps of the logic (e.g., PRNG logic or LFSR logic). For instance, consider a set of uninteresting tap history gates, typically registers, are pre-identified by a designer or user of the verification solution, and are deemed as uninteresting with respect to the dependence on past tap values. Thus, step 206 may eliminate the influence of potential X values propagating through the uninteresting tap history gates. The set of the tap history gates may be kept at a minimum and carefully audited to reduce the risk of failure to detect interesting valid collisions, representing design bugs.

A two-design comparison at step 204 exhaustively checked for collisions and in order to eliminate the contribution of the uninteresting tap history gates, a third design may be inserted called ORIGINAL. The ORIGINAL design may be an additional unmodified copy of the design. In order to eliminate the influence of identified uninteresting collision scenarios, the additional unmodified design copy (e.g., ORIGINAL) may be added to the verification model or verification solution. The ORIGINAL design may not have a modification of LFSR taps similar to step 204, EARLY.b_1 and LATE.b_j. However, an addition of the ORIGINAL design allows a modification of every uninteresting tap history gate g_i in EARLY and LATE, modifying the signals' (EARLY.g_i and LATE.g_i) values to ORIGINAL.g_i precisely when they evaluate to X in EARLY and LATE as represented as EARLY.g_i<=mux(EARLY.g_i==X, ORIGINAL.g_i, EARLY.g_i);

LATE.g_i<=mux(LATE.g_i==X, ORIGINAL.g_i, LATE.g_i).

When a property hit is encountered representing a LFSR collision, an audit may be made as to whether the LFSR collision represents a design bug to be fixed or whether the waveform trace represents uninteresting collisions to be X-suppressed at the audited at uninteresting tap history gates. Note, regarding observation points at step 204, that without a loss of uninteresting generality that the uninteresting tap history gates should never include the observation gates C or else the chosen observation gates may not have been selected appropriately.

At 208, a source of collisions in the design are identified. One or more sources of the calculated or enumerated collisions in the design are identified. An automatic pinpointing of collision logic may provide a way to automatically pinpoint or identify the earliest location of a collision in a design representing either interesting collisions (i.e., a set of likely design bugs) or candidates for a manual audit as uninteresting tap history gates. The source of collision identification may be automated, and the identified source of collisions may be presented to a user. Values at one or more sources of uninteresting collisions (e.g., uninteresting tap history gates) in the differently driven copies may be selectively overridden by the values of gates in the unmodified design copy (e.g., ORIGINAL).

The user may eliminate one or more sources of uninteresting collisions from contributing to the enumerated or calculated tap collisions. Waveform traces that correspond to the source of collisions may also be presented to the user. While awaiting the users' assessment of prior failures, an automatic pinpoint solution could suppress the identified collision sources as tentative uninteresting tap history gates, and proceed with making another verification run to see if more collisions are possible. The user may filter enumerated tap collisions to prioritize the identification of tap collisions that are likely to be design flaws, as opposed to uninteresting collisions.

If more collisions are not possible (i.e., the fail properties are all unhittable after instrumentation with X-suppression logic for uninteresting tap history gates), then the process of identifying the source of collisions may terminate and the user may be provided with all gathered information relating to the specific logic to study as the possible bug locations. The user may also use the information to audit the source as an expected uninteresting tap history gate. If another round of automation to identify the source of collision identifies a source, the next round of results may also be presented to the user along with the waveform traces so the user may audit the data. This process may repeat until no further collisions are detected.

An uninteresting tap history gate may be set as S_i if the user provided such information. If the user does not provide an uninteresting tap history gate, then set S_i may be initially left empty. The verification process in step 206 uses S_i as the uninteresting tap history gate set as follows:

EARLY.S_i<=mux(EARLY.S_i==X, ORIGINAL.S_i, EARLY.S_i);

LATE.S_i<=mux(LATE.S_i==X, ORIGINAL.S_i, LATE.S_i).

If a collision is detected, then a waveform trace T_i has been computed. An automatic identification of all candidate design error or uninteresting tap history gates, csi, is created as follows. Let c be any gate in set csi, selected automatically from T_i such that EARLY.g==X and LATE.g==X (i.e., every gate g that concurrently evaluates to X in both EARLY and LATE models in waveform trace T_i constitutes precisely the set of gates in csi). For a larger amount of automation and less manual audit or debug effort, a structural analysis may be performed of the design netlist graph to reduce set csi, finding a subset, tcsi of csi, topologically nearest to the tap points. As an option, tcsi may be limited to be a certain type of gate, such as a register or a latch, or associated to a logic within or at the input or output of strongly connected components (SCCs) of the design netlist graph. The resulting set, tcsi, may be saved and presented along with T_i to the user for categorization of design bugs versus uninteresting tap history gates. For additional automation, and while awaiting feedback from the user, the process may seed another iteration of ht is process by adding tcsi to S_i and re-running verification to enumerate additional waveforms and error candidates.

If no collision is detected, then the design has no collisions after suppressing Xes at the audited uninteresting tap history gates as per the last used S_i.

Figure 3:
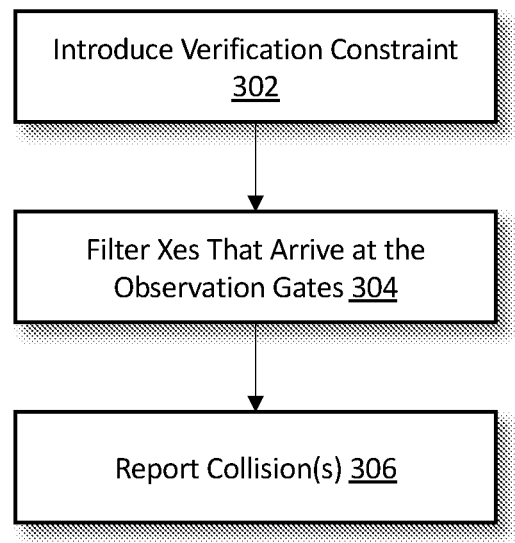
FIG. 3 is an operational flowchart illustrating a process for detecting unintended dependencies in a pseudo-random number generator (PRNG) based hardware design with an additional testbench constraint according to at least one embodiment.

Referring now to FIG. 3, an operational flowchart illustrating the exemplary detecting unintended dependencies a pseudo-random number generator (PRNG) based hardware design with an additional testbench constraint process 300 used by the dependency detection program 110a, 110b according to at least one embodiment is depicted. The detecting unintended dependencies in LFSRs with an additional testbench constraint process 300 may be considered an alternate embodiment and may also be considered an additional process to FIG. 2. Additionally, The detecting unintended dependencies in LFSRs with an additional testbench constraint process 300 may provide an automatic conservative identification of interesting collisions using a heuristic approach to identify the most interesting collisions.

Up to this point, the detecting unintended dependencies in Fibonacci LFSR based hardware designs process 200 has provided an automated exhaustive process to check for all possible LFSR tap collisions, has provided a process to eliminate uninteresting collisions and has provided a process to automatically pinpoint the location of collisions in a design to feed back into the process of eliminating uninteresting collisions for an audit. The alternate embodiment of the additional testbench may be leveraged or implemented to automatically identify or detect definitive design bug collisions as a subset of all possible identifiable collisions. The alternate embodiment may force the Fibonacci LFSR based hardware designs process 200 to seek definitive bug collisions to be used concurrently or independently so that the obtained waveforms will contain a higher amount of insight relating to design bugs.

At 302, a verification constraint is introduced. The verification constraint prevents property failures from considering waveform traces where X values propagate to observation gate g at different times in the EARLY and LATE models as represented by early_x_hit<=$d$(1, EARLY.C==X) or $d$(1, early_x_hit); and late_x_hit<=$d$(1, LATE.C==X) or $d$(1, late_x_hit).

Waveform traces when X arrives at EARLY.C, before LATE.C, or vice versa (as opposed to arriving concurrently), are less likely to be genuine design bugs and are more likely to be the result of an uninteresting tap history. In one embodiment, property failures may be ignored by constraining those scenarios away, which increases the likelihood of pinpointing a genuine design bug with less manual effort. Signals early_x_hit and late_x_hit are signals that are initialized to zero (0), assert one timestep after EARLY.C and LATE.C, respectively, evaluate to X, and remain asserted indefinitely after asserting. Thus, early_x_hit may be set to 1 when $d$(1, EARLY.C==X) or 1 timestep ago the C signal in the EARLY model holds the value X.

Note that some logic designs in sequential logic with feedback loops may be of interest when X arrives at the same observation point in both models at the same timestep and also represents the first timestep that X arrives at the observation point in either model. For example, a second timestep that X arrives at an observation point may become less interesting since, at least, the first decision could already have been made without a collision. When the observations lie on or in the fanout of sequential feedback loops, previous decisions may likely affect future decisions and collisions are, thus, expected, and become less interesting (i.e., are less likely to represent design bugs and instead an represent uninteresting tap history.

A constraint called first_x_arrival_i_j may be created to force a verification tool to restrict any evaluated execution sequence (i.e., waveform trace) to disallow illustrating any state that does not satisfy the right-hand expression. A state not satisfying the right-hand expression may be treated as unreachable and the following successor states may not be explored through the unreachable state. Consider the following constraint as a representation,

[constraint; first_x_arrival_i_j]<=not(early_x_hit or late_x_hit).

By automatically applying the referenced constraint above to the verification tool, any failing property and waveform trace are more likely to represent genuine design bugs as opposed to not using the constraint as shown in earlier processes and embodiments. However, any constraint applied to a verification tool also risks preventing the reporting of a valid design fail and may yield an unhittable proof despite the existence of certain design bugs. The method presented here in step 302 is beneficial being used in combination with previously described methods and embodiments.

For an example illustrating how this verification constraint may prevent identification of a genuine design bug, consider that there are two acyclic paths, p1 and p2, from LFSR tap b_i to the input, scc_in, to the strongly connected component (SCC) that observation gate C is in, and p1 has a shorter delay than p2. Then the constant-X driven at b_i may arrive at C earlier than the constant-X flowing through p2. Thus, consider the following representation of arbiter logic:

rand0<=($b\_5$);

rand1<=$d$(1,$b\_5$);

rand2<=$b\_6$;

where three-bit vector eight_way_choice(0:2) formed from the above three LFSR taps are used to make arbitration decisions. See the following representation, eight_way_choice(0:2)<=rand0 & rand1 & rand2.

In this representation, rand2==rand1, and therefore, eight_way_choice(1)==$d$(1, eight_way_choice(2)).

Eight req #_win signals may assert when eight_way_choice (0:2) is equal to #, such that req0_win<=eight_way_choice(0:2)="000";

req1_win<=eight_way_choice(0:2)="001";

req2_win<=eight_way_choice(0:2)="010";

req3_win<=eight_way_choice(0:2)="011";

req4_win<=eight_way_choice(0:2)="100";

req5_win<=eight_way_choice(0:2)="101";

req6_win<=eight_way_choice(0:2)="110";

req7_win<=eight_way_choice(0:2)="111";

The req #_win signals feed into the strongly connected component (SCC) that controls which pending request (req0 . . . req7) gets a grant according to the first requester in circular order from the winner selected by which of req #_win is asserted. The req # signals may go low (i.e., change from 1 to 0) on the clock after gnt(#) and may randomly assert, if not already asserted, and after asserting will remain asserted until receiving a gnt(#). For instance, gnt(0:7)<=if(req #_win are all zero) then
"00000000" else [one-hot vector selecting a
single req0 . . . req7 to receive the grant]; and

[observable; collision_at_gnt1]<=gnt(0:7).

The X driven at tap b_5 arrives at the arbiter logic strongly connected component (SCC) by way of rand0 at 1 timestep earlier than the X by way of rand1. This shows a collision at the observation involving only the taps sampled by rand1 and rand2, however, no collision may be reported using the first_x_arrival_i_j constraint. Alternatively, without the first_x_arrival_i_j constraint and step 204 in FIG. 2, the reported collision may involve the X (in EARLY) propagated from rand0, which may be considered an uninteresting collision, or may be considered a genuine design bug. To further improve the applicability of the first_x_arrival constraint while minimizing the chance of missed genuine design bugs, an additional embodiment is next described.

At 304, the Xes that arrive at the observation gates are filtered. Xes are filtered at strongly connected components (SCC) inputs in order to filter the Xes that arrive at the observation strongly connected components (SCCs) before or earlier than the Xes that cause collisions at a first arrival of the observation gate. Using an additional model, a $3^{rd}$ model, of ORIGINAL as in step 206 in FIG. 2, the SCC_IN is identified which are the set of inputs to the observation strongly connected component (SCC). Then, for each scc_in of SCC_IN, new random signals EARLY_scc_in_filter and LATE_SCC_in_filter are created. Next, the behavior of the following signals is overridden as follows:

EARLY.scc_in<=mux(EARLY_scc_in_filter, ORIGI-
NAL.scc_in, EARLY.scc_in);

LATE.scc_in<=mux(LATE_scc_in_filter, ORIGI-
NAL.scc_in, LATE.scc.in).

With these modifications, it is possible to run steps 204, 206 and 208 from FIG. 2 with the constraint first_arrival_i_j while offering greater automation in exposing genuine design bugs with less user intervention of auditing uninteresting tap history.

At 306, one or more collisions are reported. The collision from rand1 and rand2 may be reported with X-filtering applied to rand0 in EARLY.

Figure 4:
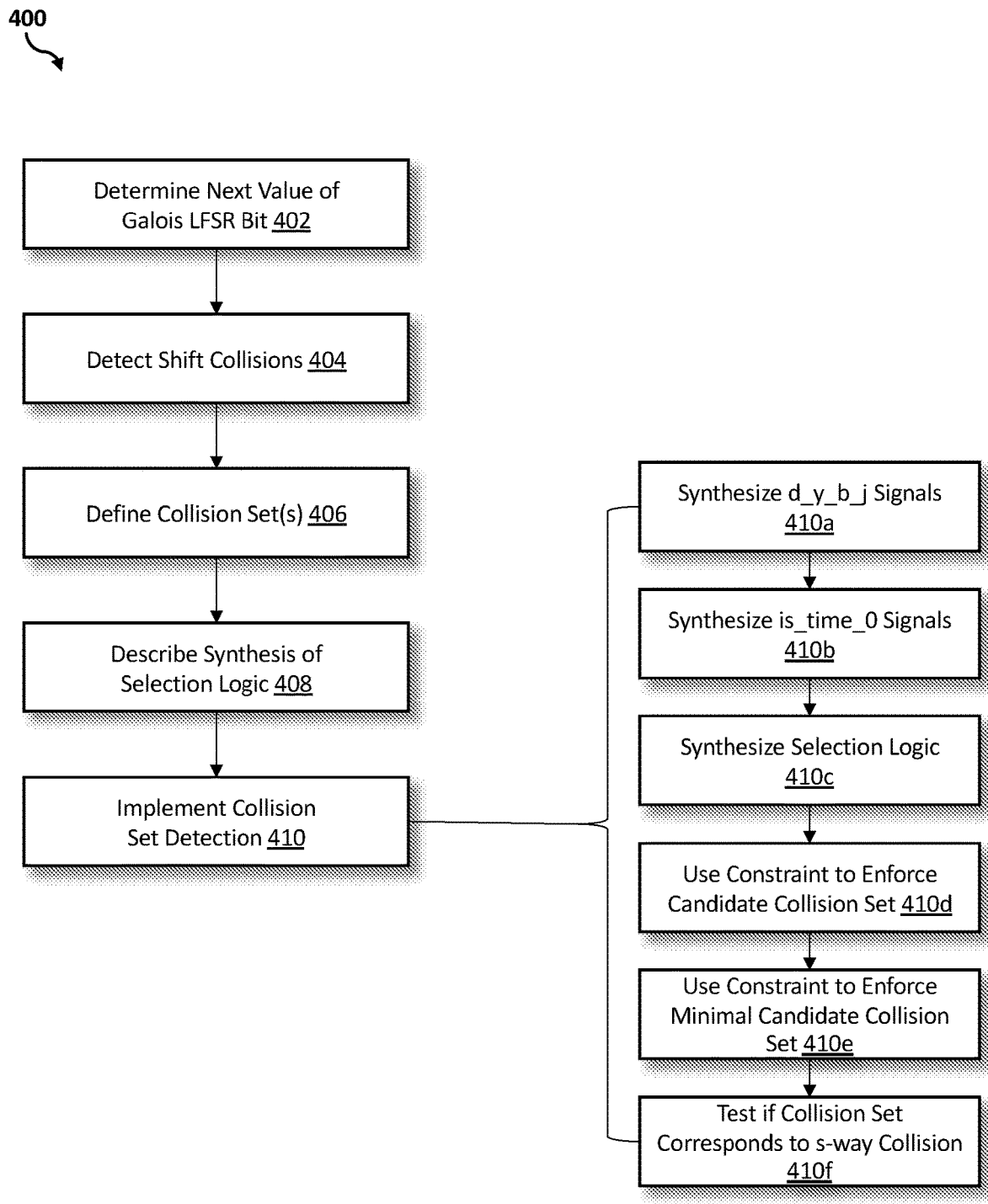
FIG. 4 is an operational flowchart illustrating a process for detecting unintended dependencies in Galois linear feedback shift registers (LFSRs) and n-bit collisions constraints according to at least one embodiment.

Referring now to FIG. 4, an operational flowchart illustrating the exemplary detecting unintended dependencies in Galois linear feedback shift registers (LFSRs) and n-bit collisions constraint process 400 used by the dependency detection program 110a, 110b according to at least one embodiment is depicted. The detecting unintended dependencies in Galois LFSRs and n-bit collisions constraint process 400 may be considered an extension of, an alternate embodiment or may also be considered an additional process to FIGS. 2-3 to identify multi-tap collisions in both Fibonacci and Galois LFSRs.

At 402, the next value of a Galois LFSR bit is determined. The next value of a Galois LFSR bit is computed from the previous state of two other bits, or from the previous state of another bit via shifting. The Galois LFSR uses 2-input XOR gates which is distinct from Fibonacci LFSRs that use a single large XOR gate to compute a new value of b_0. For example, a representation of a 16-bit maximum length Galois LFSR has a next state determined by $b\_10 <= d(1, b\_0 \text{ xor } b\_11)$ $b\_12 <= d(1, b\_0 \text{ xor } b\_13)$ $b\_13 <= d(1, b\_0 \text{ xor } b\_14)$ $b\_15 <= d(1, b\_0)$ $b\_i <= d(1, b\_\{i+1\})$ for $i=0,1,2,3,4,5,6,7,8,9,11,14$.

At 404, shift collisions are detected. Using the LFSR example at step 402, a shift collision may be detected between any pair of bits indexed 0 up to 9. Detecting collisions across an XOR gate, involving bits 10-15 require an analysis of more than 2 bits. To illustrate, since b_10<=d (1, b_0 xor b_11), and b_6<=d(4, b_10), the equality b_6==d(5, b_0) xor d(5, b_11) is invariant. Thus, shifting collisions in Fibonacci LFSRs may be generalized to a collision set (CS) to characterize and detect dependencies between LFSR bits across XOR gates. Shifting collisions in Fibonacci LFSRs are where the collisions to check are between pairs of distinct taps between which the shifting delay is inferred.

Note that XOR( ) and AND( ) applied to a single parameter is the identity function, that is XOR(d(1, b_j1)) is equivalent to AND(d(1, b_j1)) which is equivalent to d(1, b_j1). References to a state variable at time i+1 are replaced by references to its next state-function at time i. References to a state variable at time 0 are replaced by references to its initial value or possibly fresh input variables in the case of inductive unfolding. The term unfolding may refer to creating a combinational netlist representing the behavior of a sequential netlist for a specific number of timesteps.

At 406, collision set(s) are defined. A collision set, CS, is a set of ordered pairs (y, j), where each y>=0 represents a delay, each j is the index of a tap b_j, exactly one pair has y=0, named (0, i). The pair (0, i) may be determined by using rewriting rules to deduce the invariant (e.g., b_6==d(5, b_0) xor d(5, b_11)) to normalize a single delay to 0, such as subtracting the minimum delay present in any pair from the delays of all pairs. A subset, CS' of CS, exists such that the subset includes (0, i), where the LFSR design has the following invariant for LFSR bit b_i and is represented by $b\_i == \text{XOR}\_\{\text{over all } (y,j) \text{ in CS' with } y>0\} d(y, b\_j)$ and a collision set is called minimal if the collision set includes no pairs that are not participating in this representation. A shorthand notation of {(y, j) in CS' with y>0} may include the notation CS_{dnz}, where dnz represents delay nonzero.

The notion of a collision set allows the detection of collisions involving the same bit at different delays. The taps may be generalized to delay taps, which are values of taps at a fixed delay. In the Galois LFSR example, b_6==d(5, b_0) xor d(5, b_11), the simultaneous dependence on any two of the taps, b_6,d(5, b_0) and d(5, b_11) may not be considered a collision since the pairs or the two taps may practically take any combination of values. For example, a simultaneous dependence upon b_6 and d(5, b_0) is not a collision since the lack of additional simultaneous dependence with d(5, b_11) means that the values of b_6 and d(5, b_0) are not interdependent.

A simultaneous dependence on all three taps may be considered a collision since the values the taps take are constrained by the LFSR implementation. In order to detect collisions among three or more taps (e.g., PRNG taps or LFSR taps), each with a specified relative delay (i.e., a collision set), a sequential logic design or a sequential logic representation may be constructed that characterizes all collision sets of interest according to correlations within design up to a configurable maximum collision set size and a maximum relative delay.

The preceding processes (e.g., processes and alternate embodiments described thus far) are compatible with detecting collisions between 3, or general s>=3, delay taps. As in step 204, tap collisions may be enumerated or calculated using a multiple copy design verification model or testbench. Instead of comparing the two models EARLY and LATE, and possibly ORIGINAL, the comparison is between s=|CS| models named as M_1, . . . M_s.

From the example at step 402, the representation of a 16-bit maximum length Galois LFSR next state, three models may be used, M_1, M_2 and M_3, with corresponding delay taps (0, 6), (5, 0) and (5, 11), respectively. In a similar case as the 2-tap collision, the testbench chooses a nondeterministic time to drive X at b_0 (in M_3), drive X at time t+5 at b_11 (in M_2), and drive X at time t+5 at b_6 (in M_1). All other inputs may be driven identically across all models. Using an observation, C, the fail property is

[fail; collision_3]<=$M\_1.C==X$ and $M\_2.C==X$ and $M\_3.C==X$.

At 408, a synthesis of selection logic is described. Using a similar process as in step 204 to identify observation points, by specifying an appropriate collision set under consideration, the synthesis of selection logic may be described by choosing which group of s=|CS| delay taps to check for a collision. At step 406, the three valued comparison between s copies (i.e., multiple copies) of the model may be driven and may have a fail property analogous to the [fail; collision_3].

Two parameter values may be necessary to specify the size and delay window of collisions that are desired. A parameter, MAX_SIZE, may be the largest number of delay taps (i.e., a maximum s value) that is involved in a collision. A parameter, MAX_WINDOW, may be the largest delay between delay taps. Given LFSR design values for MAX_SIZE and MAX_WINDOW and the taps, then all possible collision sets are specified with combinational logic. To illustrate the MAX_SIZE and MAX_WINDOW parameters, consider a 16-bit Fibonacci LFSR:

$b\_0<=d(1,\text{xor}(b\_10,b\_12,b\_13,b\_15))$; and $b\_i<=d(1,b\_\{i-1\})$ for 0<i<16, where MAX_SIZE=2 and MAX_WINDOW=17 and each collision set corresponds to all pairs of taps with the delay dictated by shifting correspondence. In this example, {(0,3), (2,5)} and {(0,9), (6,15)} are minimal collisions sets. Alternatively, if MAX_SIZE>5, then an example minimal collision set is {(0,0), (1,10), (1,12), (1,13), (1,15)}, provided that each of the LFSR bits b_0, b_10, b_12, b_13 and b_15 are taps.

At 410, a collision set detection is implemented. The collision set detection is implemented by creating a combinational logic C_SET that determines collision sets, steps 410a-410d) and deriving a sequential logic from C_SET that determines if collision sets are minimal, steps 410e-410f. Then, using constraints that enforce a random selection of a minimal CS, an s-model comparison is performed that his analogous to the 2-model (EARLY/LATE) comparison.

At 410a, the d_y_b_j signals are synthesized. For all b_i of T taps, consider the MAX_WINDOW step unfolding the LFSR. The signals named d_y_b_j are synthesized to refer to the y-step unfolded value of the LFSR bit b_j. The resulting combinational logic has n inputs, d_{MAX_WINDOW}_b_i for each i=0, 1, 2, . . . , n−1, and |T| outputs, d_0_b_i for each tap b_i. All input signals d_{MAX_WINDOW}_b_i are driven to zero (0). Then d_y_b_j is defined by unfolding each signal d_y_b_j that is assigned based on the driving of b_j from the LFSR implementation. If b_j is driven as $b\_j<=\text{XOR}(d(1,b\_j1),d(1,b\_j2), \ldots , d(1,b\_jk))$;

then d_y_b_j for each y=0, 1, . . . , MAX_WINDOW−1 is $d\_y\_b\_j<=\text{AND}$ $(d\_\{y+1\}\_b\_j1,d\_\{y+2\}\_b\_j2, \ldots , d\_\{y+1\}\_b\_jk)$.

Each d_y_b_j signal has a corresponding input select signal, sel_d_y_b_j. For pairs (0, i), signal d_0_b_i is gated by its select signal sel_d_0_b_i. Thus, for each d_0_b_i, the assignment d_0_b_i<={right-hand expression} is replaced with d_0_b_i<=sel_d_0_b_i AND {right-hand expression}.

For pairs (y, j) where y>0, when sel_d_y_b_j is asserted, d_y_b_j is also asserted. For each signal d_y_b_j such that b_j is a tap and y>0, d_y_b_j<={right-hand expression} is replaced with d_y_b_j<=sel_d_y_b_j OR {right-hand expression}. All signals sel_d_y_b_j are driven to zero (0) unless otherwise noted.

Add input signals cs_sat_sel and cs_min_sel. Also add signal some_bi_sat driven as the disjunction of all d_0_b_i signals which indicates that the selected b_i is satisfied, for example, some_bi_sat<=OR $(d\_0\_b\_1,d\_0\_b\_2, \ldots , d\_0\_b\_m)$.

Add the signals cs_sat_b_i and cs_min_b_i, which will assert if the candidate CS is a collision set. The added signals cs_sat_b_i and cs_min_b_i will be driven as cs_sat_$b\_i$<=some_$b\_i$_sat AND cs_sat_sel, which remains asserted on timesteps 1 to s−1 if CS is minimal, such as cs_min_$b\_i$<=some_$bi$_sat AND cs_min_sel.

At 410b, the is_time_0 signals are synthesized. The size, s, values for steps 410b-410f may be s=2, 3, . . . , MAX_SIZE, where MAX_SIZE>1. The signal, is_time_0, is high (e.g., a value of 1) during the first timestep only and the signal is_time_1_to_sm1 is synthesized, which is high during timesteps 1 to s−1 inclusive.

At 410c, the selection logic is synthesized. The selection logic that randomly chooses a candidate collision set is synthesized with ceiling(log_2 |T|)*s bits to select s taps and ceiling(log_2 MAX_WINDOW)*(s−1) bits to select s−1 delays for the nonzero delay taps. At timestep 0, cs_sat_sel is driven to 1 and cs_min_sel is driven to 0. The selection logic may be used to randomly choose s−1 signals of sel_d_y_b_j for y>0, and drive these signals to 1, and randomly choose exactly one signal sel_d_0_b_i and drive the signal to 1. If driving sel_d_y_b_j<=1 for each (y, j) of CS satisfies d_0_b_i, then the pair (0, i) and all s−1 pairs (y, j) together are a collision set that is captured in the signal some_bi_sat by driving cs_sat_sel to 1 at timestep 0.

At 410*d*, the constraint to enforce a candidate collision set is used. The constraint, CS_is_valid_b_i, is used to enforce that the candidate collision set adheres to the collision set defined in step 406 and is represented as follows,

[constraint; CS_is_valid_*b_i*]<=is_time_0 IMPLIES cs_sat_*b_i*.

Note that the CS selections that this constraint does not hold violates step 406 in that b_i is determined by the delay taps of the CS.

At timesteps 1, 2, . . . , s−1, cs_sat_sel is driven to 0 and cs_min_sel is driven to 1, and sel_d_y_b_j<=1 for each (y, j) of CS. In a fixed order, each element (y, j) of CS_{dnz} is iterated through, for example, increasing order of j*MAX_WINDOW+y. At each step, sel_d_y_b_j is driven to 0 for that step only. If d_0_b_i is satisfied at any of these steps, then cs_min_b_i will de-assert during some step. If the signal cs_min_b_i de-asserts, then the CS under consideration is not minimal.

At 410*e*, the constraint to enforce a minimal candidate collision is used. The constraint CS_is_minimal_b_i is used to enforce that the candidate collision set is minimal after time 0. See the following representation,

[constraint; CS_is_minimal_*b_i*]<=is_time_1to_sm1 IMPLIES cs_min_*b_i*.

Note that when the constraint does not hold for the CS selections means that b_0 is determined by a strict subset of CS_{dnz}. Thus, at least one delay tap is unnecessary and searching for a collision may allow a false negative response or scenario. A false negative scenario may identify that a collision exists between some delay taps, but not all of them.

At 410*f*, the collision set is tested to determine if the collision set corresponds to an s-way collision. Independent taps may be driven differently across multiple design copies while other design inputs are driven identically across copies. A filtering constraint may be used to prioritize the identification of collisions that are more likely to be design flaws versus uninteresting collisions, which may result from sequential feedback logic, and may not be considered design flaws. Testing if the collision set, CS, corresponds to an s-way collision may be used with any of the preceding solutions presented, including the solutions provided in FIGS. 2-3. The comparison may uses models, named M_1, . . . , M_s for each d_y_b_j of CS. The model corresponding to d_y_b_j drives constant X at tap b_j at y timestep earlier than the model for d_0_b_i that drives constant X at tap b_i. For observation C, the fail property to detect a collision may be represented as follows:

[fail; collision_*s*]<=AND_[1<=*i*<=*s*]: *M_i*.C==*X*.

The event or procedure may terminate when a collision_s event is hit, indicating that a minimal collision was found as encoded by the selection of CS. The event or procedure may also terminate when all collision_s fail properties are proven unhittable, which indicates that no collisions exist at C.

Figure 5:
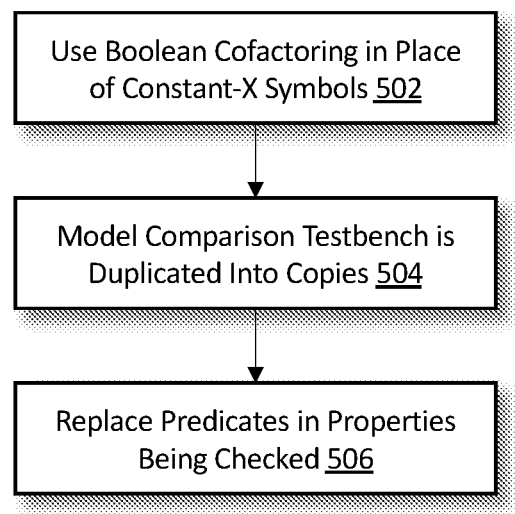
FIG. 5 is an operational flowchart illustrating a process for eliminating X-pessimism according to at least one embodiment.

Referring now to FIG. 5, an operational flowchart illustrating the exemplary eliminating X-pessimism process 500 used by the dependency detection program 110*a*, 110*b* according to at least one embodiment is depicted. The eliminating X-pessimism process 500 may be used or leveraged to avoid spurious collisions arising from X-pessimism in FIGS. 2-4 and may optionally be implemented for collision detection testbenches. X-pessimism refers to ambiguity in evaluating Boolean design logic under three-valued (3-valued) semantics, where the ternary X value is unknown and could either be Boolean 0 or 1. In scenarios when the fail property is hit but no real collision exists, it may be due to the X-pessimism. The eliminating X-pessimism process 500 may eliminate the spurious hits, may be considered an alternate embodiment and may also be considered an additional process to FIGS. 2-4.

At 502, the Boolean cofactoring approach is used in place of constant-X symbols. The differently driven predefined value may be a Boolean cofactored value driven to different Boolean values in two Boolean-cofactored copies of the multiple-copy design verification model. The verification properites may be added at defined observation points to check for concurrent sensitization to different Boolean values across the Boolean co-factored copies of the verification model. The Boolean cofactoring is used in place of constant X-symbols to eliminate the spurious hits, allowing a more precise Boolean evaluation of logic. Recall that the only difference between EARLY and LATE designs are the following overrides representations:

EARLY.*b_i*<=mux(COFACTOR_TIME_EARLY, constant-*X*, CUTPOINT_*b_i*);

and

LATE.*b_j*<=mux(COFACTOR_TIME_LATE, constant-*X*, CUTPOINT_*b_j*).

Instead of injecting constant-X, a Boolean random constant value, COFACTOR_SYMBOL, may be introduced. The Boolean random constant value may be introduced and implemented as a register with a nondeterministic initial value in which the next-state function is itself, thus, the Boolean random constant value chooses a nondeterministic value at time 0 and holds that value thereafter. A representation of using the Boolean random constant value in place of constant-X is as follows:

EARLY.*b_i*<=mux(COFACTOR_TIME_EARLY, COFACTOR_SYMBOL, CUTPOINT_*b_i*); and

EARLY.*b_j*<=mux(COFACTOR_TIME_EARLY, COFACTOR_SYMBOL, CUTPOINT_*b_j*).

At 504, the model comparison testbench is duplicated into copies. The 2- or n-model comparison testbench is duplicated into copies, C0 versus C1, when the COFACTOR_SYMBOL is driven to 0 in C0 and 1 in C1. The duplication of the 2-model comparison testbench may require that each signal b_i involves 4 copies, C0.EARLY.b_i, C1.EARLY.b_i, C0.LATE.b_i and C1.LATE.b_i.

At 506, the predicates are replaced in properties being checked. The predicates of the form (M.C==X) are replaced with (C0.M.C/=C1.M.C) in the properties being checked, where /=means not equal. For example,

[fail; collision_*i_j*]<=(EARLY.C==*X*) and (LATE.C==*X*); becomes

[fail; collision_*i_j*]<=(C0.EARLY.C/=C1.EARLY.C) and (C0.LATE.C/=C1.LATE.C).

Note that the approach of a single cofactoring may accurately model the ==X multi-value case because each EARLY and LATE may only check for dependence of C upon a single bit at one timestep with pre-defined temporal synchronization COFACTOR_TIME_EARLY and COFACTOR_TIME_LATE. The cofactoring C0/C1 approach using step 204 may double the size for a testbench to 4× the original design size, which is double the design under testing (DUT) in a 2-model comparison. The multi-value synthesis of a 3-valued testbench may also double the testbench size compared to a comparable Boolean-valued testbench, requiring duplication of each Boolean signal to allow representing 3 values at each signal. A 3-valued approach using step 204 may also yield a comparable 4× overhead versus design size using step 204. Note that in embodiments using step 206, the ORIGINAL design copy may not have Xes inserted and may not need to be modeled as 3-value or Boolean-cofactored, thus, the testbench size may be 5× the size of the original design in embodiments using step 206.

An additional alternate embodiment to the eliminating X-pessimism process 500 may include eliminating X-pessimism with uninteresting tap history gate filtering. Using the eliminating X-pessimism process 500 with step 206 may provide a non-empty set of uninteresting tap history gates and the COFACTOR_SYMBOL approach may cause more unreachable state behavior than necessary when stitching in values for gates g_i from the ORIGINAL model. The solution provided at step 206 may be modified with the elimination of X-pessimism by avoiding the ORIGINAL model or design copy entirely.

Instead of driving EARLY.b_i and LATE.b_j with cofactor COFACTOR_SYMBOL in C0 and C1 as stated in the eliminating X-pessimism process 500, C0.EARLY.b_i may be left unchanged as driven by the corresponding CUTPOINT_b_i and driving C1.EARLY.b_i by the inverse of C0.EARLY.b_i (and similarly for C0.LATE.b_j and C1.LATE.b_j). See the following representations:

$C0.EARLY.b\_i <= CUTPOINT\_b\_i;$ $C1.EARLY.b\_i <= mux(COFACTOR\_TIME\_EARLY, NOT(C0.EARLY.b\_i), CUTPOINT\_b\_i);$ $C0.LATE.b\_j <= CUTPOINT\_b\_j;$ and $C1.LATE.b\_j <= mux(COFACTOR\_TIME\_EARLY, NOT(C0.LATE.b\_j), CUTPOINT\_b\_j).$ Next, the uninteresting tap history gates g_i for step 206 and step 208 are overridden only in the C1 models, directly sampling from the C0 model to override into the C1 model. For example, $C1.EARLY.g\_i <= mux(C0.EARLY.g\_i/=C1.EARLY.g\_i), C0.EARLY.g\_i, C1.EARLY.g\_i);$ and $C1.LATE.g\_j <= mux(C0.LATE.g\_j == C1.LATE.g\_j), C0.LATE.g\_j, C1.LATE.g\_j).$ The C0 model may remain unmodified. The present modeling is to ensure that the suppression of Xes on the uninteresting tap history gates does not cause a larger than necessary degree of unreachable state behavior to be introduced in the EARLY and LATE models when selectively overriding the uninteresting tap history gates from another copy of the design (i.e., ORIGINAL in step 206) that are driven by slightly different input values. A secondary benefit to this model that is immune to X-pessimism is that it only results in logic 4× the size of the original design, compared to 5× when suppressing the uninteresting tap history gates in step 206.

It may be appreciated that FIGS. 2-5 provide only an illustration of one embodiment and do not imply any limitations with regard to how different embodiments may be implemented. Many modifications to the depicted embodiment(s) may be made based on design and implementation requirements.

Figure 6:
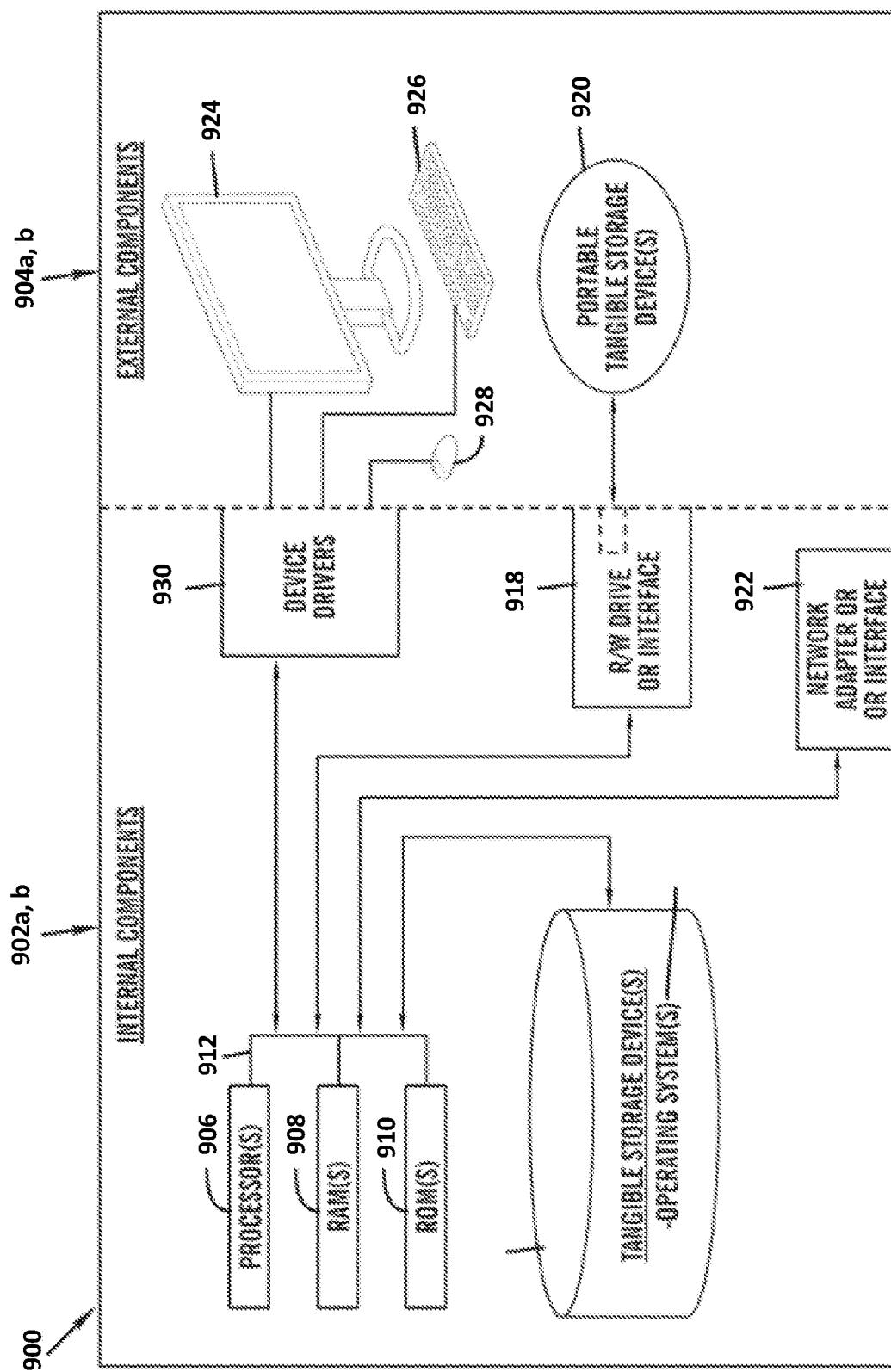
FIG. 6 is a block diagram of internal and external components of computers and servers depicted in FIG. 1 according to at least one embodiment.

FIG. 6 is a block diagram 900 of internal and external components of computers depicted in FIG. 1 in accordance with an illustrative embodiment of the present invention. It should be appreciated that FIG. 6 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may be represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Computer 102 and server 112 may include respective sets of internal components 902*a*, *b* and external components 904*a*, *b* illustrated in FIG. 6. Each of the sets of internal components 902*a*, *b* includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914, the software program 108, and the dependency detection program 110*a* in client computer 102, and the dependency detection program 110*b* in network server 112, may be stored on one or more computer-readable tangible storage devices 916 for execution by one or more processors 906 via one or more RAMs 908 (which typically include cache memory). In the embodiment illustrated in FIG. 6, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902*a*, *b* also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the dependency detection program 110*a*, 110*b* can be stored on one or more of the respective portable computer-readable tangible storage devices 920, read via the respective R/W drive or interface 918 and loaded into the respective hard drive 916.

Each set of internal components 902*a*, *b* may also include network adapters (or switch port cards) or interfaces 922 such as a TCP/IP adapter cards, wireless wi-fi interface cards, or 3G/4G/5G wireless interface cards or other wired or wireless communication links. The software program 108 and the dependency detection program 110*a* in the computer 102 and the dependency detection program 110*b* in a network server 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the dependency detection program 110*a* in computer 102 and the dependency detection program 110b in network server computer 112 are loaded into the respective hard drive 916. The network may comprise copper wires, optical fibers, wireless transmission, routers, firewalls, switches, gateway computers and/or edge servers.

Each of the sets of external components 904a, b can include a computer display monitor 924, a keyboard 926, and a computer mouse 928. External components 904a, b can also include touch screens, virtual keyboards, touch pads, pointing devices, and other human interface devices. Each of the sets of internal components 902a, b also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure or on a hybrid cloud infrastructure. The applications are accessible from various client devices through a thin client interface such as a web browser (e.g., web-based e-mail). The consumer does not manage or control the underlying cloud infrastructure including networks, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Analytics as a Service (AaaS): the capability provided to the consumer is to use web-based or cloud-based networks (i.e., infrastructure) to access an analytics platform. Analytics platforms may include access to analytics software resources or may include access to relevant databases, corpora, servers, operating systems or storage. The consumer does not manage or control the underlying web-based or cloud-based infrastructure including databases, corpora, servers, operating systems or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 7:
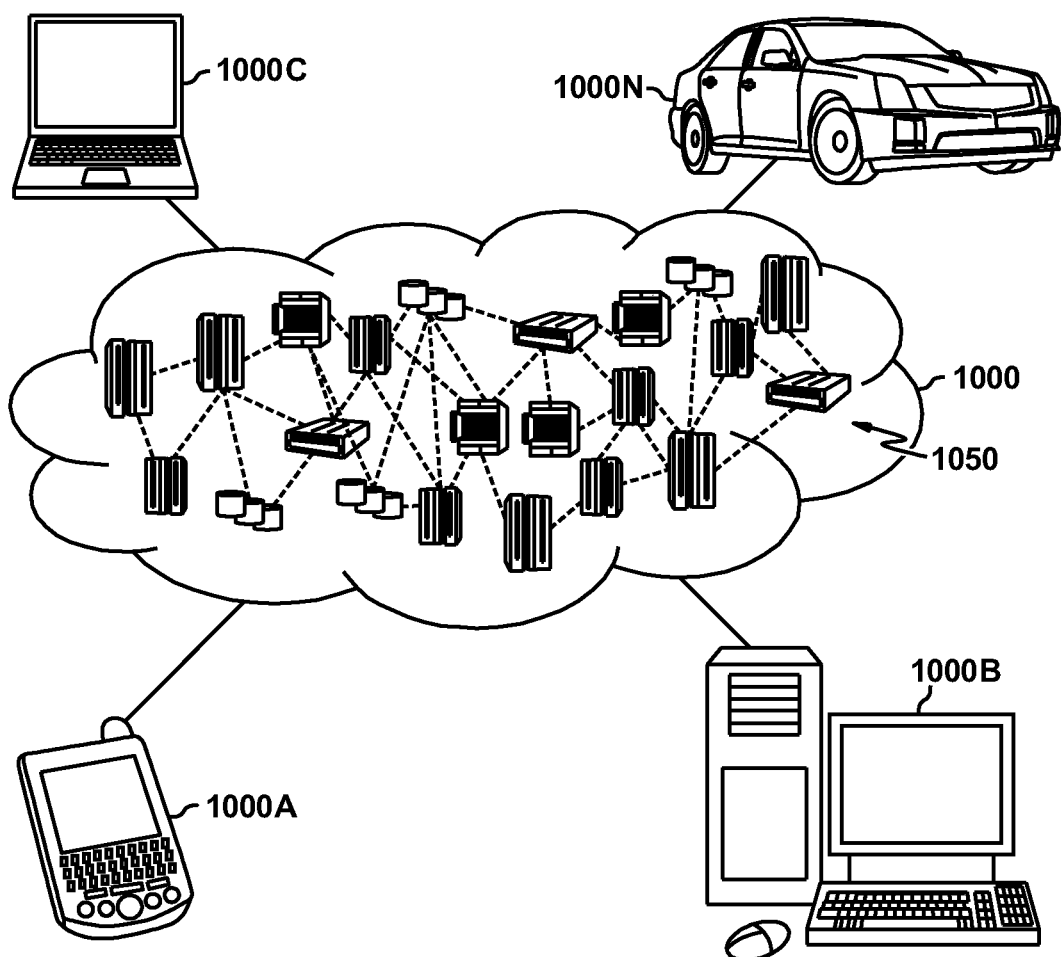
FIG. 7 is a block diagram of an illustrative cloud computing environment including the computer system depicted in FIG. 1, in accordance with an embodiment of the present disclosure.

Referring now to FIG. 7, illustrative cloud computing environment 1000 is depicted. As shown, the cloud computing environment 1000 includes one or more cloud computing nodes 1050 with which local computing devices used by cloud consumers, such as, for example, personal digital assistant (PDA) or cellular telephone 1000A, desktop computer 1000B, laptop computer 1000C, and/or automobile computer system 1000N may communicate. Cloud computing nodes 1050 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 7 are intended to be illustrative only and that computing nodes 1050 and cloud computing environment 1000 can communicate with any type of computerized device over any type of network and/or network addressable connection (e.g., using a web browser).

Figure 8:
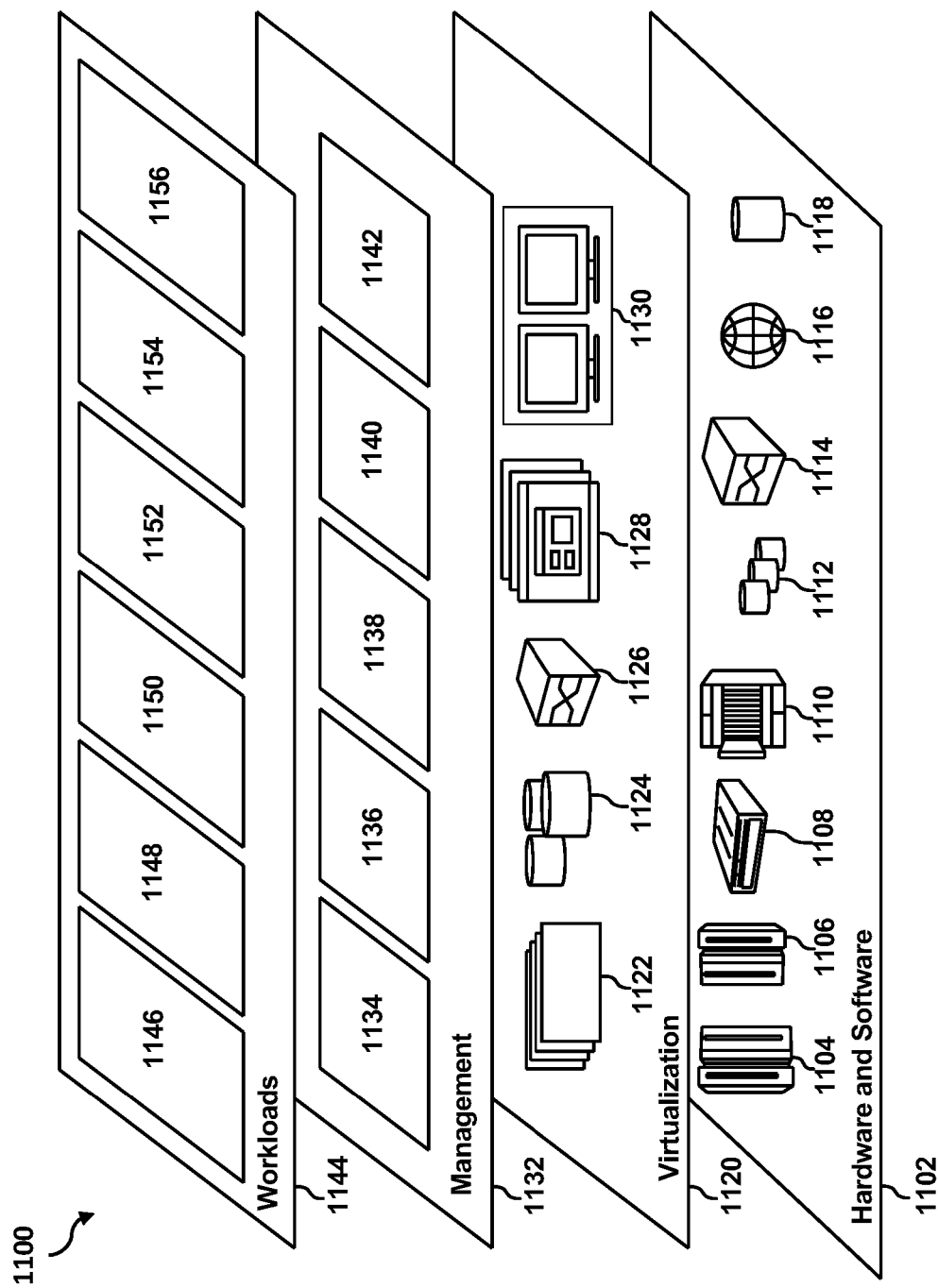
FIG. 8 is a block diagram of functional layers of the illustrative cloud computing environment of FIG. 7, in accordance with an embodiment of the present disclosure.

Referring now to FIG. 8, a set of functional abstraction layers 1100 provided by cloud computing environment 1000 is shown. It should be understood in advance that the components, layers, and functions shown in FIG. 8 are intended to be illustrative only and embodiments of the invention are not limited thereto. As depicted, the following layers and corresponding functions are provided:

A hardware and software layer 1102 include hardware and software components. Examples of the hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, a management layer 1132 may provide the functions described below. Resource provisioning 1134 provides dynamic procurement of computing resources and other resources that are utilized to perform tasks within the cloud computing environment. Metering and pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions that may be provided from this layer include: mapping and navigation 1146; software development and lifecycle management 1148; virtual classroom education delivery 1150; data analytics processing 1152; transaction processing 1154; and dependency detection 1156. A dependency detection program 110a, 110b provides a way to detect unintended dependencies in linear feedback shift register (LFSR) designs.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language, python programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for detection of unintended dependencies between hardware design signals from pseudo-random number generator (PRNG) taps, the method comprising:
    identifying one or more pseudo-random number generator (PRNG) tap points in a hardware design as an execution sequence;
    sampling the tap points by propagating the tap points onto fanout signals in the design with different delays;
    defining observation points to identify tap collisions based on the tap points;
    identifying the tap collisions;
    identifying one or more sources of the tap collisions in the design;
    eliminating one or more sources of uninteresting tap collisions out of the tap collisions; and
    filtering one or more of the tap collisions.

2. The method of claim 1, further comprising:
    detecting collisions with three or more pseudo-random number generators (PRNGs) taps, wherein each of the three or more pseudo-random number generators (PRNGs) taps is propagated with a specified relative delay; and
    constructing a sequential logic representation that characterizes all collision sets of interest according to pseudo-random number generator (PRNG) design correlations within a pseudo-random number generator (PRNG) design up to a configurable maximum collision set size and a maximum relative delay.

3. The method of claim 1, wherein the unintended dependencies are detected between hardware design signals from pseudo-random number generators (PRNGs) that are linear feedback shift registers (LFSRs), Fibonacci linear feedback shift registers (LFSRs) or Galois linear feedback shift registers (LFSRs).

4. The method of claim 1, wherein the tap collisions are enumerated by using a multiple-copy design verification model, wherein independent taps are differently driven across multiple design copies and other design inputs are driven identically across the multiple design copies.

5. The method of claim 4, wherein the independent taps that are driven differently across the multiple design copies are driven by a pre-defined value applied at different times across the multiple design copies, wherein a difference in time is dependent on a logical time-shifted correlation in corresponding taps or delay taps of a pseudo-random number generators (PRNGs) logic.

6. The method of claim 1, wherein the observation points have added verification properties to check for concurrent sensitization to the tap collisions, wherein the tap collisions are taps that are driven differently across multiple design copies.

7. The method of claim 1, wherein the uninteresting tap collisions are eliminated by adding an unmodified copy of the design to a verification model, wherein values at the one or more sources of the uninteresting tap collisions are selectively overridden by gate values in the unmodified copy of the design of differently driven copies.

8. The method of claim 1, wherein filtering the one or more tap collisions uses a filtering constraint to prioritize identifying if the tap collisions are a design flaw or an uninteresting collision.

9. A computer system for detection of unintended dependencies between hardware design signals from pseudo-random number generator (PRNG) taps, comprising:
one or more processors, one or more computer-readable memories, one or more computer-readable tangible storage media, and program instructions stored on at least one of the one or more computer-readable tangible storage media for execution by at least one of the one or more processors via at least one of the one or more computer-readable memories, wherein the computer system is capable of performing a method comprising:
identifying one or more pseudo-random number generator (PRNG) tap points in a hardware design as an execution sequence;
sampling the tap points by propagating the tap points onto fanout signals in the design with different delays;
defining observation points to identify tap collisions based on the tap points;
identifying tap collisions;
identifying one or more sources of the tap collisions in the design;
eliminating the one or more sources of uninteresting tap collisions out of the tap collisions; and
filtering one or more of the tap collisions.

10. The computer system of claim 9, further comprising:
detecting collisions with three or more pseudo-random number generators (PRNGs) taps, wherein each of the three or more pseudo-random number generators (PRNGs) taps is propagated with a specified relative delay; and
constructing a sequential logic representation that characterizes all collision sets of interest according to pseudo-random number generator (PRNG) design correlations within a pseudo-random number generator (PRNG) design up to a configurable maximum collision set size and a maximum relative delay.

11. The computer system of claim 9, wherein the unintended dependencies are detected between hardware design signals from pseudo-random number generators (PRNGs) that are linear feedback shift registers (LFSRs), Fibonacci linear feedback shift registers (LFSRs) or Galois linear feedback shift registers (LFSRs).

12. The computer system of claim 9, wherein the tap collisions are enumerated by using a multiple-copy design verification model, wherein independent taps are differently driven across multiple design copies and other design inputs are driven identically across the multiple design copies.

13. The computer system of claim 12, wherein the independent taps that are driven differently across the multiple design copies are driven by a pre-defined value applied at different times across the multiple design copies, wherein a difference in time is dependent on a logical time-shifted correlation in corresponding taps or delay taps of a pseudo-random number generators (PRNGs) logic.

14. The computer system of claim 9, wherein the observation points have added verification properties to check for concurrent sensitization to the tap collisions, wherein the tap collisions are taps that are driven differently across multiple design copies.

15. The computer system of claim 9, wherein the uninteresting tap collisions are eliminated by adding an unmodified copy of the design to a verification model, wherein values at the one or more sources of the uninteresting tap collisions are selectively overridden by gate values in the unmodified copy of the design of differently driven copies.

16. The computer system of claim 9, wherein filtering the one or more tap collisions uses a filtering constraint to prioritize identifying if the tap collisions are a design flaw or an uninteresting collision.

17. A computer program product for detection of unintended dependencies between hardware design signals from pseudo-random number generator (PRNG) taps, comprising:
one or more computer-readable tangible storage media and program instructions stored on at least one of the one or more computer-readable tangible storage media, the program instructions executable by a processor to cause the processor to perform a method comprising:
identifying one or more pseudo-random number generator (PRNG) tap points in a hardware design as an execution sequence;
sampling the tap points by propagating the tap points onto fanout signals in the design with different delays;
defining observation points to identify tap collisions based on the tap points;
identifying tap collisions;
identifying one or more sources of the tap collisions in the design;
eliminating the one or more sources of uninteresting tap collisions out of the tap collisions; and
filtering one or more of the tap collisions.

18. The computer program product of claim 17, further comprising:
detecting collisions with three or more pseudo-random number generators (PRNGs) taps, wherein each of the three or more pseudo-random number generators (PRNGs) taps is propagated with a specified relative delay; and
constructing a sequential logic representation that characterizes all collision sets of interest according to pseudo-random number generator (PRNG) design correlations within a pseudo-random number generator (PRNG) design up to a configurable maximum collision set size and a maximum relative delay.

19. The computer program product of claim 17, wherein the unintended dependencies are detected between hardware design signals from pseudo-random number generators (PRNGs) that are linear feedback shift registers (LFSRs), Fibonacci linear feedback shift registers (LFSRs) or Galois linear feedback shift registers (LFSRs).

20. The computer program product of claim 17, wherein the tap collisions are enumerated by using a multiple-copy design verification model, wherein independent taps are differently driven across multiple design copies and other design inputs are driven identically across the multiple design copies.

* * * * *